(12) United States Patent
Hien et al.

(10) Patent No.: US 6,514,663 B1
(45) Date of Patent: Feb. 4, 2003

(54) BOTTOM RESIST

(75) Inventors: Stefan Hien, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/560,542

(22) Filed: Apr. 28, 2000

(30) Foreign Application Priority Data

Apr. 28, 1999 (DE) .......................................... 199 19 392

(51) Int. Cl.[7] .............................................. G03F 7/004
(52) U.S. Cl. .................................... 430/270.1; 430/914
(58) Field of Search ............................. 430/270.1, 914

(56) References Cited

U.S. PATENT DOCUMENTS

| | | | |
|---|---|---|---|
| 5,502,003 A | 3/1996 | Ogino et al. ................. | 437/189 |
| 5,512,334 A * | 4/1996 | Leuschner et al. ........... | 427/558 |
| 5,580,695 A | 12/1996 | Murata et al. | |
| 5,595,855 A | 1/1997 | Padmanaban et al. | |
| 5,629,135 A | 5/1997 | Kobayashi et al. | |
| 5,648,196 A | 7/1997 | Fréchet et al. | |
| 5,939,236 A * | 8/1999 | Pavelchek et al. ........ | 430/273.1 |
| 6,114,085 A * | 9/2000 | Padmanaban et al. ... | 430/270.1 |
| 6,306,553 B1 * | 10/2001 | Kihara et al. ............. | 430/270.1 |

FOREIGN PATENT DOCUMENTS

| | | |
|---|---|---|
| EP | 0 534 273 A1 | 3/1993 |
| EP | 0 542 008 A1 | 5/1993 |
| EP | 0 813 114 A2 | 12/1997 |
| JP | 60 161 621 A | 8/1985 |
| JP | 02 181 910 A | 7/1990 |
| JP | 07 238 196 A | 9/1995 |
| JP | 11 072 925 A | 3/1999 |
| JP | 11 095 418 A | 4/1999 |

OTHER PUBLICATIONS

Stefan Hien et al. "Dual–Wavelength Photoresist for Sub–200 nm Lithography", *Proc. SPIE 1998*, vol. 3333, pp. 154–164.
G.L. Harris et al.: "Ohmic contacts to SiC", in "Properties of Silicone Carbide", 1995, Inspec, London, Great Britain, pp. 231–234.
J. Crofton et al.: "The Physics of Ohmic Contacts SiC", Phys. Stat. Sol. (b) 202 (1997), pp. 581–603.
Lisa M. Porter et al.: "A critical review of ohmic and rectifying contacts for silicon carbide", Materials Science and Engineering, vol. B34, 1995, pp. 83–105.
J. Crofton et al.: High–temperature ohmic contact to n–type 6H–SiC using nickel, J. Appl. Phys. vol. 77 No. 3, Feb. 1, 1995, pp. 1317–1319.
C. Hallin et al.: "Interface chemistry and electrical properties of annealed Ni and Ni/Al–6H SiC structures", Inst. Phys. Conf. Ser. No. 142, Chapter 3, paper presented at Silicon Carbide and Related Materials 1995 Conf., Kyoto, Japan.
"Advances in Chemical Amplification Resist Systems" (Ito), dated Dec. 1992, Jpn. J. Appl. Phy. vol. 31, pp. 4273–4282, as mentioned on p. 1 of the specification.
"Deep–UV photoresists for sub 0.25 µm processing" (Krisa et al.), dated May–Jun. 1997, Advanced Lithography, pp. 17–24, as mentioned on p. 1 of the specification.

* cited by examiner

*Primary Examiner*—Rosemary Ashton
(74) *Attorney, Agent, or Firm*—Laurence A. Greenberg; Werner H. Stemer; Ralph E. Locher

(57) ABSTRACT

A bottom resist for the two-layer technique includes a phenolic base polymer, a thermoactive compound which above a temperature of 100° C. releases a sulfonic acid, and a solvent.

22 Claims, No Drawings

BOTTOM RESIST

BACKGROUND OF THE INVENTION

Field of the Invention

The invention relates to a bottom resist for the two-layer technique.

In microelectronics, resists are used for planarization and for optical decoupling of substrates. These resists must be able to be applied to the substrate by a spin coating technique and cured by appropriate techniques. Furthermore, it must be ensured that the resists are insoluble when overcoated with a photoresist as is used for exposures in the deep UV (248 nm, 193 nm, 157 nm or 126 nm). The photoresists used with preference in this wavelength range are based on the principle known as chemical amplification (cf., for example, Jpn. J. Appl. Phys., Vol. 31 (1992), Pt. 1, No. 12B, pages 4273 to 4282). A disadvantage here, however, is that the resists react with great sensitivity to the basicity or acidity of the underlying material (cf., for example, TI Technical Journal, Vol. 14, No. 3, May–June 1997, pages 17 to 23).

In the single-layer technique, resists which are resistant to substrate etching are used on thin antireflection layers possessing a very low resistance to substrate etching in a halogen plasma. These materials are intended specifically to cause superimposition of optical reflections and to generate an interference pattern which following development leads to vertical structures in the top resist. Although these thin materials (<100 nm) are adapted in terms of acidity to chemically amplified resists, their etch resistance makes them unsuitable for applications in the conventional two-layer technique (thin film imaging).

So-called bottom resists adapted to the two-layer technique with chemically amplified photoresists have not been disclosed to date. A so-called CARL resist (CARL—Chemical Amplification of Resist Lines) used in the I-line technology (exposure at 365 nm) is a diazonaphthoquinone-based resist which is baked at a temperature of about 300° C. for several minutes. Owing to the high proportion of basic constituents, however, this material cannot be used as an underlayer for chemically reinforced resists. Following development, indeed, unacceptable residual layers remain in the exposed regions, or there is what is known as footing; i.e., the developed structures are substantially broader at the interface with the underlying bottom resist and, consequently, the desired vertical profiles are not produced.

Similar comments apply to negative resist systems which operate with crosslinking agents containing basic groups, such as nitrogen atoms. Negative resists of this kind, furthermore, are only insoluble in aqueous-alkaline developers, but lack sufficient insolubility and swelling resistance in the solvent of the top resist that is to be applied.

SUMMARY OF THE INVENTION

It is accordingly an object of the invention to provide a bottom resist intended for the two-layer technique that overcomes the above-mentioned disadvantages of the prior art and affords both a well-adapted surface acidity in order to be compatible with chemically reinforced photoresists and also a high level of stability in a halogen plasma as used for the structuring of the underlying substrate, such as silicon.

With the foregoing and other objects in view there is provided, in accordance with the invention, a bottom resist comprising the following components:

a phenolic base polymer,
a thermoactive compound which releases a sulfonic acid above a temperature of 100° C., and
a solvent.

The proportion of base polymer is advantageously from 8 to 40% by mass, preferably from 8 to 15% by mass, and the proportion of thermoactive compound is advantageously from 0.005 to 4% by mass, preferably from 0.02 to 0.1% by mass, the remainder (to 100% by mass) comprising solvent.

The bottom resist according to the invention is tailored to the chemically reinforced two-layer technique which uses a thin photosensitive resist over a thick planarizing layer which is resistant to substrate etching. With this bottom resist, the crosslinking reaction is purely thermal, and takes place at relatively low temperatures (>100° C.) and within a short time (<90 s). The shelf life of the bottom resist is for example at least six months at a temperature, of 40° C. The base polymer of the resist includes a high proportion of aromatic structures, thereby imparting a high level of etch stability.

The bottom resist according to the invention can advantageously further comprise one or more of the following components:

Crosslinking-active compound (concentration: from 0.005 to 4% by mass):
This compound accelerates the crosslinking or curing (of the bottom resist layer). For this purpose it is preferred to use compounds having at least two hydroxymethyl groups, such as 2,6-hydroxymethyl-p-cresol.

Basic compound (concentration: from 0.005 to 4% by mass):
Using this compound it is possible to reduce further the acidity of the surface of the resist material (after curing). For this purpose it is preferred to use pyrrolidone derivatives and piperidine derivatives, an example being N-methylpyrrolidone.

Photoactive compound thermally stable up to 235° C., which on exposure to radiation releases a sulfonic acid (concentration: from 0.005 to 4% by mass):
This compound acts to generate an acid at the interface between bottom resist and top resist upon subsequent exposure (in the two-layer technique). For this purpose it is preferred to use triarylsulfonium salts.

Dye (concentration: from 0.025 to 12% by mass):
This makes it possible to adjust the absorption and the refractive index of the resist material. The dye has an ε value >10,000 at the respective exposure wavelength. For this purpose it is preferred to use hydroxymethylanthracene (anthracenemethanol).

Additives (amount: from 0.0001 to 0.04% by mass):
These can in particular be flow control agents (leveling agents). An additive of this kind enhances the planarizing properties of the resist.

The adaptation of the bottom resist to a top resist is ensured for the following reasons:

1. The acidity can be adjusted by means of suitable acid generators and/or addition of bases as required. Acid generators, also referred to as thermal acid generators, comprise, in particular, compounds which undergo thermal decomposition at a temperature between 100 and 235° C. In principle it is possible to use a relatively large number of conventional compounds, although these compounds must be modified chemically so as to reduce the thermal stability and so that the acid generated has the desired mobility. Furthermore, the solubility must be borne in mind and it must also be ensured that the crystallization tendency (formation of particles) is as low as possible. This can be brought about by means of various chemical substituents, such as branched alkyl groups, which function as solubilizers, and by means of suitable parent structures.

2. The optical parameters can be adjusted by adding appropriate dyes. What is important in this context is a very high absorption at the exposure wavelength and a very low volatility during processing. Ideally, the dye is also able at the same time to adopt the function of a crosslinking-active compound or of a basic compound or of a photoactive, thermally stable compound, or two or more of these functions together. An appropriate dye might even serve as the thermal active compound itself.

3. The curing of the bottom resist is carried out such that no swelling effects occur when the top resist is applied. This is achieved firstly by the base polymer having a large number of chemically reactive groups and secondly by minimizing the presence of very few fractions of uncombined, free constituents. The latter is the case when after the crossinking reaction only a very small fraction of low molecular compounds remains.

The thermoactive compound (thermal acid generator) is preferably selected from one of the classes of compounds defined by the structures shown below, in each of which $X^-$ represents a sulfonate anion and a sulfonate radical:

onium salts of structure $R_2I^+X^-$ (1):

The radicals R independently of one another each denote $C_1$ to $C_{12}$ alkyl or $(C_6$ to $C_{14}$ aryl$)$—CO—$CH_2$—. In radicals R containing aromatic groups, these groups can be substituted by $C_1$ to $C_{12}$ alkyl groups, by $C_6$ to $C_{14}$ aryl groups, or by one or more alkoxy, hydroxy, halogen or nitro groups.

Onium salts of structure $R_3S^+X^-$ (2) or $R_2ArS^+X^-$ (3):

The radicals R independently of one another each denote $C_1$ to $C_{12}$ alkyl or $(C_6$ to $C_{14}$ aryl$)$—CO—$CH_2$— or two radicals R together form a tetramethylene group and Ar denotes $C_6$ to $C_{14}$ aryl, of which one or two carbon atoms can be replaced by O, N or S. The aromatic radicals Ar can be substituted by $C_1$ to $C_{12}$ alkyl groups, by $C_6$ to $C_{14}$ aryl groups, or by one or more alkoxy, hydroxy, halogen or nitro groups. In onium salts of structure (2), R can also denote benzyl ($C_6H_5$—$CH_2$—), in which case the aromatic component can be unsubstituted or substituted by an alkoxy, hydroxy, halogen or nitro group.

Onium salts of structure $RI^+ArI^+R2X^-$ (4) or $R_2S^+ArS^+R_22X^-$ (5):

The radicals R independently of one another each denote $C_1$ to $C_{12}$ alkyl or $(C_6$ to $C_{14}$ aryl$)$—CO—$CH_2$— or two adjacent radicals R together form a tetramethylene group and Ar denotes $C_6$ to $C_{14}$ aryl, of which one or two carbon atoms can be replaced by O, N or S. The aromatic radicals Ar can be substituted by $C_1$ to $C_{12}$ alkyl groups, by $C_6$ to $C_{14}$ aryl groups, or by one or more alkoxy, hydroxy, halogen or nitro groups.

Benzylsulfonic esters of structure Ar—$CH_2$—X:

Ar here denotes $C_6$ to $C_{14}$ aryl, in which one or two carbon atoms can be replaced by O, N or S. The aromatic radical can be substituted by one or more alkyl, alkoxy, hydroxy, halogen, cyano or nitro groups.

The sulfonate anions $X^-$ and the sulfonate radical X are selected preferably from one of the following groups:

linear, branched or cyclic $C_1$ to $C_{12}$ alkylsulfonate group, for example, a hexadecylsulfonate, cyclohexanesulfonate or camphorsulfonate group;

mono-, poly- or perhalogenated $C_1$ to $C_{12}$ alkylsulfonate group, for example, a trifluoromethane sulfonate (triflate) or nonafluorobutanesulfonate group;

mono- or polyhalogenated $C_6$ to $C_{14}$ arylsulfonate group, for example, a pentafluorobenzenesulfonate group;

$C_6$ to $C_{14}$ arylsulfonate group substituted one or more times by an electron acceptor, for example a dinitrobenzene sulfonate group;

$C_6$ to $C_{14}$ arylsulfonate group substituted one or more times by a $C_1$ to $C_4$ alkyl radical, for example, a p-toluenesulfonate group.

The following thermoactive compounds may be mentioned by way of example:

Onium salts of structure (1):

Dimethyliodonium p-toluenesulfonate, diethyliodonium nonafluorobutanesulfonate, methyl(phenylcarboxymethyl) iodonium p-toluenesulfonate and methyl (anthrylcarboxymethyl)iodonium nonafluorobutanesulfonate.

Onium salts of structure (2) and (3):

Trimethylsulfonium camphorsulfonate, dimethyl (phenylcarboxymethyl)sulfonium p-toluenesulfonate, benzylthiolanium nonafluorobutanesulfonate, p-methoxybenzylthiolanium triflate, p-nitrobenzylthiolanium triflate, anthryldimethylsulfonium triflate and phenothiazinyldimethylsulfonium triflate.

Onium salts of structure (4) and (5):

In this case the aromatic radical Ar can, for example, be bisphenyl or anthryl, such as in bis(methyliodonium)-9,10-anthracene bistriflate.

Benzylsulfonic esters:

Benzyl-p-toluenesulfonate, p-methoxybenzylcamphorsulfonate, p-cyanobenzylcamphorsulfonate, o-nitrobenzyltoluenesulfonate and phenothiazinylmethyl-p-toluenesulfonate.

In the bottom resist according to the invention, the phenolic base polymer is preferably a novolak or a poly-p-hydroxystyrene. Examples of further suitable base polymers are polyimides and polybenzoxazoles each having phenolic OH groups. In general, at least every third monomer unit in the base polymer, on average, has an OH group.

The solvent is preferably propylene glycol monomethyl ether acetate (methoxypropyl acetate), cyclopentanone, cyclohexanone, γ-butyrolactone, ethyl lactate, or a mixture of at least two of these compounds. In general, however, all common photoresist solvents can be used.

The bottom resists according to the invention are combined with selected top resists, especially with chemically reinforced CARL resists (cf. Proc. SPIE, 1998, Vol. 3333, pages 154 to 164). In this context the exposure wavelength also plays an important part, since the optical parameters, such as the real and imaginary components of the refractive index, are dependent on the wavelength.

Other features which are considered as characteristic for the invention are set forth in the appended claims.

Although the invention is described herein as embodied in a bottom resist, it is nevertheless not intended to be limited to the details given, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the following examples.

The invention is further illustrated by working examples (pbw=part(s) by weight).

EXAMPLE 1

Preparation of a Crosslinkable Bottom Resist

A crosslinkable bottom resist is prepared from 15.5 pbw of novolak, 1 pbw of benzylthiolanium nonafluorobutanesulfonate (thermal acid generator)) and 83.5 pbw of propylene glycol monomethyl ether acetate. Subsequent filtration through a 0.2 μm ultrafine filter gives a ready-to-use solution. If this solution is stored at 23° C. the viscosity remains constant for a year.

EXAMPLE 2

Preparing a Crosslinked Bottom Resist Layer

The solution of Example 1 is applied by spin coating to a silicon wafer at 2500 rpm and is subsequently baked on a hot plate at 110° C./90 s and 225° C./90 s to give a light-absorbing layer which is 0.5 μm thick and is resistant to cyclohexanone, propylene glycol monomethyl ether acetate, ethyl lactate, and other resist solvents.

EXAMPLE 3

Preparation of a Crosslinkable Bottom Resist

A crosslinkable bottom resist is prepared from 14.5 pbw of novolak, 1 pbw of benzylthiolanium nonafluorobutanesulfonate (thermal acid generator), 1 pbw of 2,6-dihydroxymethyl-p-cresol (crosslinking-active compound) and 83.5 pbw of propylene glycol monomethyl ether acetate. Subsequent filtration through a 0.2 μm ultrafine filter gives a ready-to-use solution. If this solution is stored at 23° C. the viscosity remains constant for a year.

EXAMPLE 4

Preparing a Crosslinked Bottom Resist Layer

The solution of Example 3 is applied by spin coating to a silicon wafer at 2500 rpm and is subsequently baked on a hot plate at 110° C./90 s and 200° C./90 s to give a light-absorbing layer which is 0.5 μm thick and is resistant to cyclohexanone, propylene glycol monomethyl ether acetate, ethyl lactate, and other resist solvents.

EXAMPLE 5

Preparation of a Highly Sensitive Photoresist for Deep UV Exposure (CARL Top Resist)

7.6 pbw of a copolymer (MW: 15,000 g/mol) obtained by free-radical addition polymerization of maleic anhydride with tert-butyl methacrylate and allyltrimethylsilane are dissolved together with 0.4 pbw of triphenylsulfonium trifluoromethanesulfonate in 92 pbw of cyclohexanone, followed by filtration through a 0.2 μm ultrafine filter, to give a ready-to-use photoresist solution for exposure in the deep UV: for example, at 248 nm or 193 nm.

EXAMPLE 6

Production of Positive Photoresist Structures (Two-layer Technique)

The photoresist of Example 5 is applied at 2500 rpm to a silicon wafer pretreated as in Example 2 and 4, respectively, and is baked in each case at 130° C. for 90 s. Projected onto this wafer using a 248 nm projection exposure unit at a dose of 20 mJ/cm$^2$ is the image of a mask having line/space structures in the grating from 0.40 to 0.14 μm. The wafer is subsequently baked on a hot plate at 130° C. for 60 s. The layer is then developed by the puddle technique using a 0.26 N tetramethylammonium hydroxide developer for 60 s and subsequently baked on the hot plate at 100° C. for 60 s. Line/space structures 0.2 μm high in the grating are resolved to 0.15 μm. Under the scanning electron microscope, a section through the resist lines shows steep vertical structures which extend straight upward even at the interface with the bottom resist.

EXAMPLE 7 (COMPARATIVE TEST)

Preparation of a Crosslinkable Bottom Resist

A self-crosslinkable bottom resist is prepared from 16.5 pbw of novolak and 83.5 pbw of propylene glycol monomethyl ether acetate. Subsequent filtration through a 0.2 μm ultrafine filter gives a ready-to-use solution.

EXAMPLE 8

Preparing a Crosslinked Bottom Resist Layer

The solution of Example 7 is applied by spin coating to a silicon wafer at 2500 rpm and is subsequently baked on a hot plate at 110° C./90 s and 250° C./90 s to give a light-absorbing layer which is 0.5 μm thick and is resistant to cyclohexanone, propylene glycol monomethyl ether acetate, ethyl lactate, and other resist solvents.

EXAMPLE 9

Production of Positive Photoresist Structures (Two-layer Technique)

The photoresist of Example 5 is applied at 2500 rpm to a silicon wafer pretreated as in Example 8, and is baked at 130° C. for 90 s. Projected onto this wafer using a 248 nm projection exposure unit at a dose of 20 mJ/cm$^2$ is the image of a mask having line/space structures in the grating from 0.40 to 0.14 μm. The wafer is subsequently baked on a hot plate at 130° C. for 60 s. The layer is then developed by the puddle technique using a 0.26 N tetramethylammonium hydroxide developer for 60 s and subsequently baked on the hot plate at 100° C. for 60 s. 0.2 μm high line/space structures in the grating are resolved to 0.18 μm. Under the scanning electron microscope, a section through the resist lines shows marked "footing", i.e., a greater width at the interface with the bottom resist.

EXAMPLE 10 (COMPARATIVE TEST)

Preparation of an Acid-containing Crosslinkable Bottom Resist

A crosslinkable bottom resist is prepared from 15.5 pbw of novolak, 1 pbw of nonafluorobutanesulfonic acid (free acid) and 83.5 pbw of propylene glycol monomethyl ether acetate. Subsequent filtration through a 0.2 μm ultrafine filter gives a ready-to-use solution. If this solution is stored at 23° C. the viscosity changes significantly after just a few weeks.

EXAMPLE 11

Preparing a Crosslinked Bottom Resist Layer

The solution of Example 10 is applied by spin coating to a silicon wafer at from 2500 to 3000 rpm and is subsequently baked on a hot plate at 110° C./90 s and 225° C./90 s to give a light-absorbing layer which is 0.5 μm thick and is resistant to cyclohexanone, propylene glycol monomethyl ether acetate, ethyl lactate, and other resist solvents.

EXAMPLE 12

Production of Positive Photoresist Structures (Two-layer Technique)

The photoresist of Example 5 is applied at 2500 min$^{-1}$ to a silicon wafer pretreated as in Example 11, and is baked at 130° C. for 90 s. Projected onto this wafer using a 248 nm projection exposure unit at a dose of 20 mJ/cm² is the image of a mask having line/space structures in the grating from 0.40 to 0.14 μm. The wafer is subsequently baked on a hot plate at 130° C. for 60 s. The layer is then developed by the puddle technique using a 0.26 N tetramethylammonium hydroxide developer for 60 s and subsequently baked on the hot plate at 100° C. for 60 s. 0.2 μm high line/space structures in the grating are resolved to 0.17 μm. Under the scanning electron microscope, a section through the resist lines shows marked "undercut" i.e., an undermining of the structures at the interface with the bottom resist. This is also the cause of reduced adhesion of relatively small structures.

We claim:

1. A bottom resist for the two-layer technique, having a surface acidity adapted to be compatible with a chemically reinforced resist and having a high level of stability in a halogen plasma, comprising a phenolic base polymer having on average one hydroxyl group for at least every third monomer unit in the base polymer, a thermoactive organic sulfur compound which releases a sulfonic acid at a temperature above 100° C., a solvent, and a triarylsulfonium salt as a photoactive compound which is thermally stable up to 235° C. and which on exposure to radiation releases a sulfonic acid at the interface between the bottom resist and the top resist to further adapt the surface acidity of the bottom resist to the chemically reinforced resist.

2. The bottom resist according to claim 1, wherein the thermoactive compound is a benzylsulfonic ester of structure Ar—CH$_2$—X wherein Ar denotes C$_6$ to C$_{14}$ aryl in which not more than two carbon atoms can be replaced by O, N or S, and X denotes a sulfonate radical.

3. The bottom resist according to claim 1, wherein the base polymer is a novolak or poly-p-hydroxystyrene.

4. The bottom resist according to claim 1, additionally comprising a crosslinking-active compound.

5. The bottom resist according to claim 4, in which the crosslinking-active compound is a compound having at least two hydroxymethyl groups.

6. The bottom resist according to claim 1, additionally comprising a basic compound.

7. The bottom resist according to claim 6, wherein the basic compound is a pyrrolidone derivative or a piperidine derivative.

8. The bottom resist according to claim 1, additionally comprising a dye.

9. The bottom resist according to claim 8, wherein the dye is hydroxymethylanthracene.

10. The bottom resist according to claim 1, additionally comprising a flow control agent.

11. The bottom resist according to claim 1, wherein the solvent is selected from the group consisting of methoxypropyl acetate, cyclopentanone, cyclohexanone, gamma-butyrolactone, ethyl acetate, and mixtures thereof.

12. The bottom resist of claim 1, wherein the triarylsulfonium salt is triphenylsulfonium trifluoromethanesulfonate.

13. A bottom resist for the two-layer technique, comprising
 a phenolic base polymer having on average one hydroxyl group for at least every third monomer unit in the base polymer,
 a thermoactive organic sulfur compound which releases a sulfonic acid at a temperature in the range 100° C. to 235° C., and a solvent, wherein the thermoactive compound is an onium
 salt of structure (1) R$_2$I$^+$X$^-$, (2) R$_3$S$^+$X$^-$, (3) R$_2$ArS$^+$X$^-$, (4) RI$^+$ArI$^+$R2X$^-$ or (5) R$_2$S$^+$ArS$^+$R$_2$2X$^-$;
 in structure (1) each radical R is independently selected from the group consisting of C$_1$ to C$_{12}$ alkyl and (C$_6$ to C$_{14}$ aryl)—CO—CH$_2$—,
 in structure (2) each radical R is independently selected from the group consisting of C$_1$ to C$_{12}$ alkyl, (C$_6$ to C$_{14}$ aryl)—CO—CH$_2$—, and benzyl,
 in structures (3) and (5) each radical R is independently selected from the group consisting of C$_1$ to C$_{12}$ alkyl, (C$_6$ to C$_{14}$ aryl)—CO—CH$_2$—, and tetramethylene formed from two R radicals, and Ar is C$_6$ to C$_{14}$ aryl in which not more than two carbon atoms can be replaced by O, N or S,
 in structure (4) each radical R is independently selected from the group consisting of C$_1$ to C$_{12}$ alkyl and (C$_6$ to C$_{14}$ aryl)—CO—CH$_2$—, and Ar is C$_6$ to C$_{14}$ aryl in which not more than two carbon atoms can be replaced by O, N or S; and X$^-$ is an anion of an organic sulfur compound.

14. The bottom resist according to claim 13, wherein independently at each occurrence X$^-$ is selected from the group consisting of
 a linear, branched or cyclic C$_1$ to C$_{12}$ alkylsulfonate group,
 a mono-, poly- or perhalogenated C$_1$ to C$_{12}$ alkylsulfonate group,
 a mono- or polyhalogenated C$_6$ to C$_{14}$ arylsulfonate group,
 a C$_6$ to C$_{14}$ arylsulfonate group substituted by at least one electron acceptor substituent,
 a C$_6$ to C$_{14}$ arylsulfonate group substituted by at least one C$_1$ to C$_4$ alkyl radical.

15. The bottom resist according to claim 13, wherein R is a benzyl group.

16. The bottom resist according to claim 15, wherein the thermoactive compound is benzylthiolanium nonafluorobutanesulfonate.

17. The bottom resist of claim 13, additionally comprising a triarylsulfonium salt as a photoactive compound which is thermally stable up to 235° C. and which on exposure to radiation releases a sulfonic acid at the interface between the bottom resist and the top resist to further adapt the surface acidity of the bottom resist to the chemically reinforced resist.

18. The bottom resist of claim 17, wherein the triarylsulfonium salt is triphenylsulfonium trifluoromethanesulfonate.

19. A bottom resist for the two-layer technique having a surface acidity adapted to be compatible with a chemically reinforced photoresist and having a high level of stability in a halogen plasma, comprising
 a phenolic base polymer having on average one hydroxyl group for at least every third monomer unit in the base polymers,
 a thermoactive organic sulfur compound which releases a sulfonic acid at a temperature in the range 100° C. to 235° C.,
 and a solvent, additionally comprising a triarylsulfonium salt as a photoactive compound which is thermally stable up to 235° C. and which on exposure to radiation releases a sulfonic acid at the interface between the bottom resist and the top resist to further adapt the surface acidity of the bottom resist to the chemically reinforced resist.

20. The bottom resist according to claim 19, wherein the base polymer is a novolak or poly-p-hydroxystyrene.

21. A bottom resist for the two-layer technique, comprising
- a phenolic base polymer having on average one hydroxyl group for at least every third monomer unit in the base polymer,
- a thermoactive organic sulfur compound which releases a sulfonic acid at a temperature above 100° C.,
- a solvent, and a triarylsulfonium salt as a photoactive compound which is thermally stable up to 235° C. and which on exposure to radiation releases a sulfonic acid at the interface between the bottom resist and the top resist to further adapt the surface acidity of the bottom resist to the chemically reinforced resist,
- wherein the proportion of phenolic base polymer is 8–40 mass per cent, the proportion of thermoactive compound is 0.005–4 mass per cent, the proportion of triarylsulfonium salt photoactive compound is 0.005–4 mass per cent, and the remainder is solvent.

22. The bottom resist according to claim 21, wherein the proportion of base polymer is 8–15% by weight.

* * * * *